United States Patent
Spill

(10) Patent No.: US 7,005,638 B2
(45) Date of Patent: Feb. 28, 2006

(54) APPARATUS AND METHOD FOR REDUCING THE ELECTRON-BEAM-INDUCED DEPOSITION OF CONTAMINATION PRODUCTS

(75) Inventor: Burkhard Spill, Ebsdorfergrund (DE)

(73) Assignee: Leica Microsystems Semiconductor GmbH, Wetzlar (DE)

( * ) Notice: Subject to any disclaimer, the term of this patent is extended or adjusted under 35 U.S.C. 154(b) by 0 days.

(21) Appl. No.: 10/795,498

(22) Filed: Mar. 8, 2004

(65) Prior Publication Data

US 2004/0195525 A1 Oct. 7, 2004

(30) Foreign Application Priority Data

Mar. 26, 2003 (DE) .................................. 103 13 644

(51) Int. Cl.
*H01J 37/20* (2006.01)

(52) U.S. Cl. ........................ 250/306; 250/307; 250/210

(58) Field of Classification Search ................ 250/310, 250/311, 306, 307
See application file for complete search history.

(56) References Cited

U.S. PATENT DOCUMENTS

| | | | |
|---|---|---|---|
| 4,752,668 A | 6/1988 | Rosenfield et al. | |
| 6,038,015 A | 3/2000 | Kawata | |
| 6,046,457 A | 4/2000 | Bohnenkamp et al. | |
| 6,077,417 A | 6/2000 | Lee et al. | |
| 6,105,589 A | 8/2000 | Vane | |

FOREIGN PATENT DOCUMENTS

JP 10-312765 * 11/1998

* cited by examiner

*Primary Examiner*—Kiet T. Nguyen
(74) *Attorney, Agent, or Firm*—Houston Eliseeva LLP

(57) ABSTRACT

In a device for examining a specimen with an electron beam, in particular an SEM, TEM, or CSEM, contamination products are often result from the irradiation. To reduce these contamination products, the surface of the object irradiated with the electron beam is simultaneously illuminated with light, in particular with UV light.

15 Claims, 2 Drawing Sheets

APPARATUS AND METHOD FOR REDUCING THE ELECTRON-BEAM-INDUCED DEPOSITION OF CONTAMINATION PRODUCTS

RELATED APPLICATIONS

This application claims priority of the German patent application 103 13 644.4 which is incorporated by reference herein.

FIELD OF THE INVENTION

The invention concerns a method for reducing the electron-beam-induced deposition of contamination products on a specimen and an apparatus for reducing the electron-beam-induced deposition of contamination products on a specimen.

BACKGROUND OF THE INVENTION

In the microscopic examination of specimens, microscopes of various types that are suitable for the particular intended application are used. For high magnifications and high-contrast depictions, electron-beam microscopes are particularly suitable, for example a transmission electron microscope (TEM), a scanning electronic microscope (SEM) or a confocal scanning electron microscope (CSEM), with which a sample is scanned in three dimensions with the focus of an electron beam.

When samples are examined by means of electron beams, whether with a TEM, SEM, or CSEM or by electron lithography, undesirable deposits of hydrocarbon compounds or water often occur on the surface of the specimen being examined. Three causes of this, and combinations thereof, can be identified:
  the vacuum system;
  device components, for example a movable sample holder, lubricants, O-rings, etc.; and
  impurities already present on the specimen before the examination is carried out.

The contamination products on the one hand interfere with the image and on the other hand can simulate specimen features, resulting in misinterpretation. In critical dimension (CD) measurements, which are performed at high magnification and therefore with a high beam intensity per unit area, contamination on the feature being measured means a change in the actual feature width. This therefore easily leads to incorrect measurements.

When a CD measurement is carried out on masks using a CSEM, destruction of the mask can occur as a result of light-absorbing contamination. In the case of so-called defect review CSEM, the decreased conductivity of materials in the contact holes after irradiation with electrons is also known to be a problem. The deposited hydrocarbons have an electrically insulating effect.

A number of possibilities for preventing or remedying the aforementioned disadvantages are already known. U.S. Pat. No. 6,077,417, for example, proposes the use of so-called microlens stacks to improve the electron illumination system. To remove contamination from the microlens stack, it is proposed to heat each microlens of the stack individually by delivering current. This is typically carried out at a temperature of approximately 200 degrees Celsius in order to prevent deposits. Impurities that have already become attached can be removed by occasionally heating the microlenses to 600 to 700 degrees Celsius.

U.S. Pat. No. 6,105,589 discloses a method for cleaning the specimen surface. In this, the specimen surface is cleaned by means of a plasma discharge. A plasma discharge device is provided for this purpose on the specimen chamber. It can contain air or a different oxygen/nitrogen mixture. Free oxygen radicals are generated by means of the plasma discharge. These free oxygen radicals disperse by convection inside the sample chamber, and thus also reach the surface of the specimen. There these free radicals are capable of removing hydrocarbons from the surface of the specimen, converting them into CO gas or water vapor.

U.S. Pat. No. 6,038,015 furthermore discloses a method for eliminating, from a mask, contamination that has a disruptive effect when irradiation with electron beams occurs. In this, the masking is scanned and a detector senses the electrons that are emitted at the location of a contamination product. Once the impurity has been detected in this fashion, it is then removed by a mask cleaning system. A laser beam or a locally delivered reactive gas is used to remove the contamination product. Once the contamination product has been removed in this fashion, the masking is placed onto the specimen that is to be examined.

To clean the surface of a semiconductor wafer, U.S. Pat. No. 4,752,668 discloses a method that operates with the aid of an excimer laser. For this, the wafer is positioned on a stage that is displaceable in a plane, and the excimer laser is focused onto those points at which material, in particular impurities, are to be removed. The laser beam is guided through a vacuum, and the impurity is carried off by way of the vacuum pumps.

A so-called cold trap is also often used in order to improve conditions during microscope operation, and thus to create a good capability for decreasing contamination even during microscope operation at high magnifications. It is known for this purpose, for example from U.S. Pat. No. 6,046,457, to place a metal ring, in particular a copper ring, in the vicinity of the specimen that is to be examined. This method promotes the condensation of contamination products on the cold trap. This method is not, however, widespread in microscope systems that are used in the semiconductor mass-production industry, since it involves a large maintenance outlay.

SUMMARY OF THE INVENTION

It is the object of the present invention to propose a method for reducing the electron-beam-induced deposition of contamination products upon irradiation of a specimen with an electron beam that are maintenance-friendly and widely usable in the field of electron optics.

According to the present invention, this object is achieved by a method comprising the steps of:
  directing an electron beam onto a surface of the specimen,
  directing a light beam simultaneously with the electron beam onto the surface of the specimen irradiated with the electron beam.

It is a further object of the present invention to propose an apparatus for reducing the electron-beam-induced deposition of contamination products upon irradiation of a specimen with an electron beam that are maintenance-friendly and widely usable in the field of electron optics.

With regard to the apparatus, this object is achieved by an apparatus for reducing the electron-beam-induced deposition of contamination products on a specimen, comprises: a device for generating an electron beam that can be directed onto a surface of the specimen, a light source, defining a light beam proceeding from it, wherein the light source is arranged such that the surface of the specimen is illuminated with the electron beam and the light beam simultaneously.

The invention accordingly makes use of the surprising recognition that in the context of examination of a specimen using an electron beam, contamination on the specimen can be reduced by directing light of a suitable wavelength onto the specimen simultaneously with the electron beam. The use of ultraviolet light, in particular in a wavelength region from 190 nm to 400 nm, has proven particularly advantageous. This wavelength region can be generated very easily with a deuterium lamp whose light is directed onto the surface of the specimen. Advantageously, the light source is arranged for this purpose outside the examination device, i.e., for example, outside the SEM, TEM, or CSEM. The light of the lamp can then be directed into the interior of the examination device, for example through a window that is transparent to the wavelength. This is particularly advantageous because a vacuum must be produced in the interior of the examination device in order to ensure that the electron beam is directed correctly onto the specimen.

In an alternative embodiment, it is also possible to convey the light by means of a waveguide into the interior of the examination device and onto the sample. The waveguide runs through a vacuum passthrough into the interior of the examination device. This ensures that the vacuum in the interior of the examination device can be maintained. It is at the same time possible to use, outside the examination device, any desired light source with which the contamination can be reduced.

Further advantages and advantageous embodiments of the invention are the subject matter of the Figures below and of the pertinent portions of the specification.

DETAILED DESCRIPTION OF THE PREFERRED EMBODIMENTS

Figure 1:
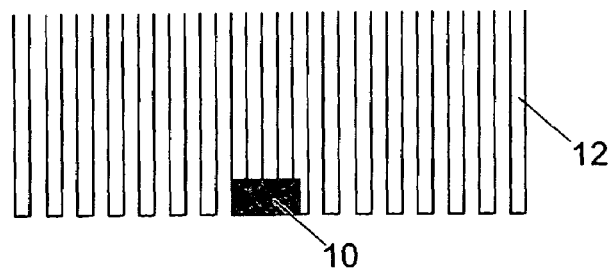
FIG. 1 schematically depicts a contamination product resulting from irradiation with an electron beam.

An electron-beam-induced deposit of hydrocarbon compounds, water, or other material on sample surfaces in the context of so-called CD-CSEM measurement is depicted schematically in FIG. 1. In this CD (critical dimension) measurement, which is performed with a confocal scanning electron microscope, high magnifications and therefore high electron-beam loads per unit area are necessary. Approximately rectangular contamination products 10 typically occur in this context upon irradiation of specimen 12. Contamination product 10 absorbs the electron radiation and thereby considerably interferes with measurement. In addition, contamination product 10 can result in destruction of the mask, which in the present case constitutes specimen 12 being examined. It is correspondingly also necessary to prevent the formation of contamination product 10 even during irradiation of specimen 12 with the electron beam, or at least to reduce it as much as possible.

It has been found, surprisingly, that the formation of contamination products 10 upon irradiation of a specimen 12 with electron beams can be reduced by directing light of a suitable wavelength onto the surface of specimen 12 simultaneously with the electron beams.

Figure 2:
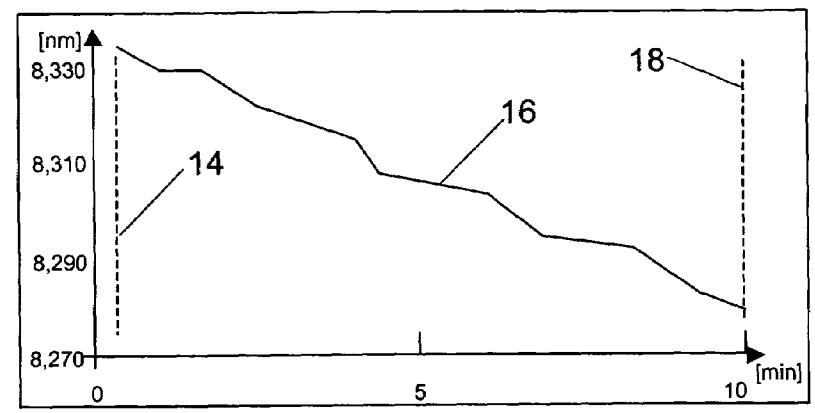
FIG. 2 is a qualitative depiction of the development over time of a contamination layer thickness upon irradiation with UV light.

The layer thickness of contamination products 10 can be determined by ellipsometer measurements, since this measurement is very sensitive in the case of thin layers. If irradiation of the measurement spot with a DUV lamp (deuterium lamp having a 190 to 400 nm wavelength range) is accomplished simultaneously with the ellipsometer measurement, a definite drop in total thickness over time can be observed. FIG. 2 reproduces the decrease in layer thickness for a period of ten minutes: upon irradiation of the measurement spot with a DUV lamp, the layer thickness decreases by approximately 0.6 Angstrom within the time span 14 to 18 depicted (i.e. ten minutes). This decrease in layer thickness can be attributed to a DUV-induced removal of the contamination layer. The chemical bond between the specimen surface and contamination products 10 is weak, comprising substantially van der Waals bonds. These are broken by the DUV irradiation. The hydrocarbons, water, or other contamination compounds on the surface of specimen 12 are thus split off by irradiation with a suitable light source, in particular with high-energy DUV radiation. They are therefore also removed from the surface of specimen 12.

As further experiments have shown, the removal rate and the total magnitude of the removed contamination layer depend on the intensity of the light used, in particular of the DUV light beam.

Figure 3:
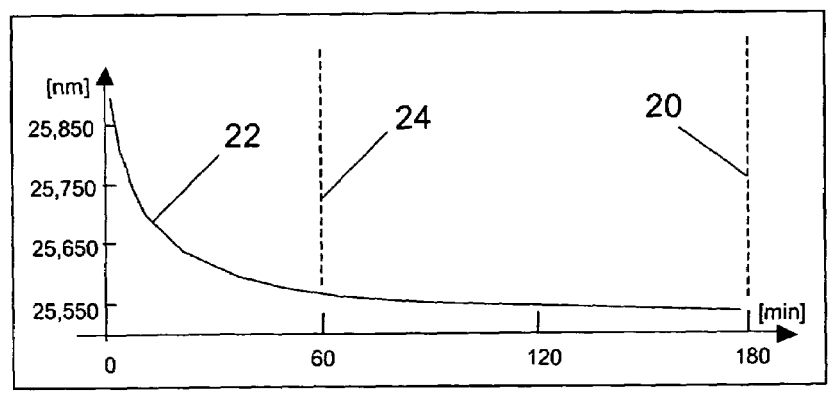
FIG. 3 is a qualitative depiction of the long-term development of the contamination layer thickness upon irradiation with UV light.

FIG. 3 depicts a layer thickness measurement which once again depicts the influence of DUV irradiation on the layer thickness of the contamination layer as a function of time. At time T=0, a contamination layer thickness of approx. 25.900 nm is present. With the passage of time the thickness of the layer decreases, as depicted qualitatively in FIG. 3, in accordance with curve 22; at time T=3 hours, indicated in FIG. 3 by the reference character 20, it has reached a value of approx. 25.548 nm. As is also evident from FIG. 3, in the context of exposure with the DUV lamp a state close to equilibrium is established from time T=1 hour (marked with reference character 24) until time 20 at which the measurement ends. This means that no further significant removal of the layer occurs in this time window between times 24 and 20. The equilibrium layer thickness is correspondingly less when a DUV lamp having a greater light intensity is used.

In the measurements on which FIGS. 2 and 3 are based, an $SiO_2$ contamination layer on a silicon substrate was measured with simultaneous DUV irradiation. Both Figures show clearly that the light energy of a DUV lamp in a wavelength region from 190 to 400 nm is sufficient to break the bond between a contamination product 10 and the surface of a specimen 12. The removal rate, however, is very slow. In other words, in the context of a short-term measurement that is typical in particular of CD measurements, an already-contaminated surface of a specimen 12 therefore cannot be completely cleaned with short-term irradiation. If irradiation with the DUV lamp is already begun before illumination of specimen 12 with the electron beam, however, the formation of further hydrocarbon deposits on specimen 12 can be prevented or at least reduced within certain limits.

Figure 4:
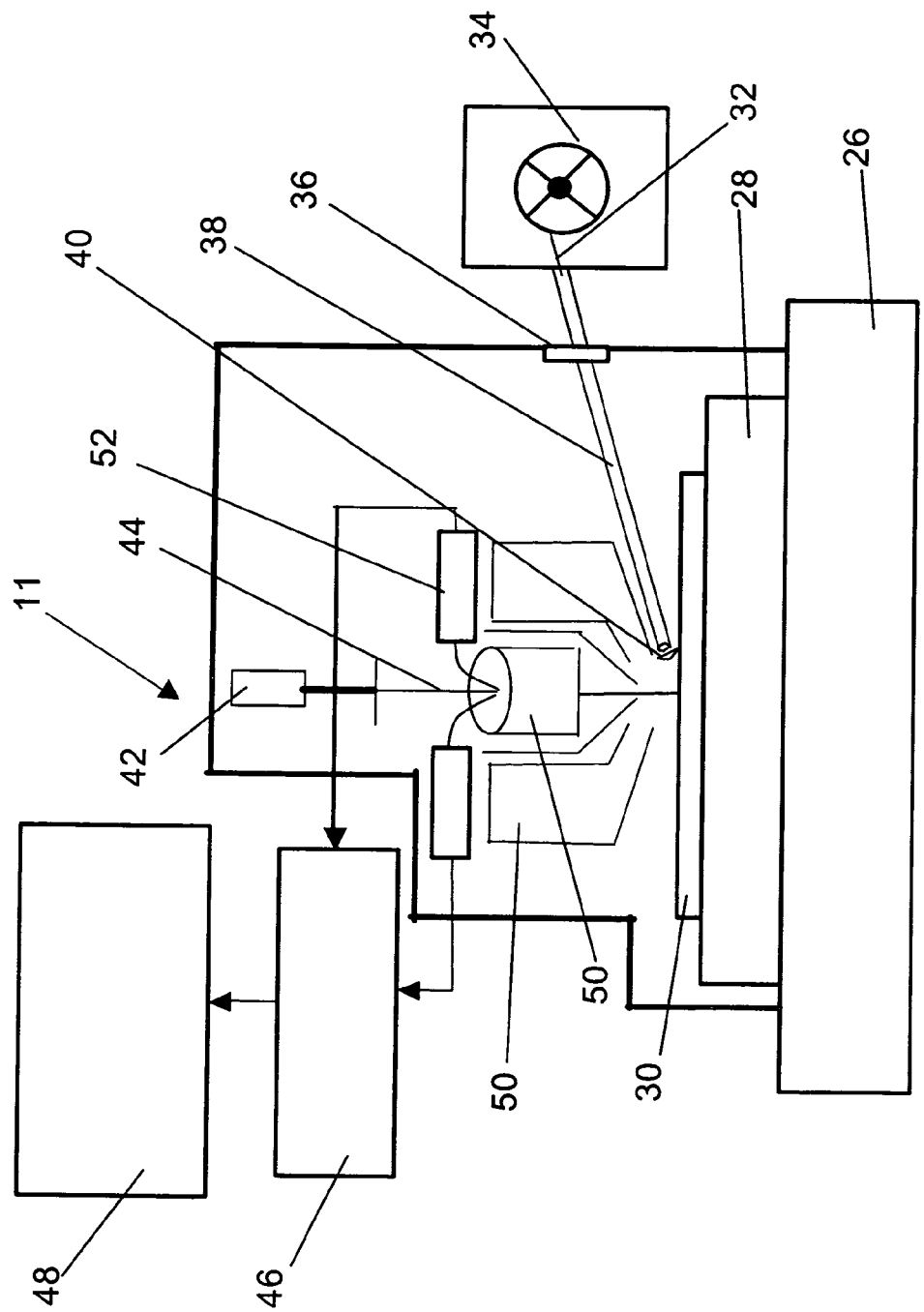
FIG. 4 schematically depicts an electron-beam examination device having a device according to the present invention for reducing contamination.

FIG. 4 shows an apparatus that can be used in many microscopes to reduce the electron-beam-induced deposition of contamination products 10. The basis taken for this in FIG. 4 is, as an example, a CSEM.

Firstly, a vibration-isolating layer 26 is typically provided. On this is mounted a positioning device 28 on which a specimen 30, for example a wafer, can be positioned. Using an electron-beam source 42, an electron beam 44 is guided through a focusing unit 50 onto the surface of specimen 30. The X-Y scanning necessary for CSEM examinations is generated by an X-Y deflection device 54. The signals obtained upon scanning of specimen 30 are acquired by detectors 52 and conveyed to a signal acquisition unit 46. Signal acquisition unit 46 is connected to a data processing and data display device 48, so that the acquired data can be processed and displayed.

Since electron-beam examination system 11 must be housed in a vacuum, it has proven favorable to house the additional illumination source, i.e. for example deuterium lamp 34, outside the vacuum in a lamp housing. Light beam 32 proceeding from deuterium lamp 34 is conveyed to a vacuum passthrough 36. Advantageously, the light beam from deuterium lamp 34 is fed directly into a light guide 38. Light guide 38 is then guided through vacuum passthrough 36 and positioned in the vicinity of the surface of specimen 30 being examined, in such a way that the light radiation can emerge at its end onto the specimen surface being examined. A focusing device 40 can additionally be provided at the end of the light guide so that the light beam can be focused exactly onto the surface of specimen 30.

Although light beam 32 of the deuterium lamp can be guided by means of a light guide 38 onto the sample, it is of course also possible to use a window that is transparent to the light being used. The light beam can thereby enter the interior of electron-beam examination device 11.

If only portions of light 32 emitted by lamp 34, for example a specific spectral region, are to be used, suitable light filters can be utilized.

Light source 34 can also be arranged in the interior of electron-beam examination device 11 for the examination of specimen 30. A prerequisite for this, however, is it be appropriate in terms of the installation space in the interior of electron-beam examination device 11, and the type of light source 34. Sensors 52 for the detection of signals that result from irradiation of specimen 30 with electron beam 44 are preferably arranged in such a way that they are not influenced by light beam 32.

What is claimed is:

1. A method comprising the steps of:
   directing an electron beam onto a surface of a specimen; and
   reducing the electron beam induced deposition of contamination products on the specimen by directing a light beam simultaneously with the electron beam onto the surface of the specimen irradiated with the electron beam.

2. The method as defined in claim 1, wherein the light beam has a wavelength in the ultraviolet region, in particular in the region between 190 nm and 400 nm.

3. The method as defined in claim 1, wherein the surface of the specimen is illuminated with the light beam prior to irradiation of the surface of the specimen with the electron beam.

4. The method as defined in claim 1, wherein the electron beam and the specimen are arranged in a device for examining the specimen, and the light source of the light beam is arranged outside the device.

5. The method as defined in claim 4, wherein the light beam proceeding from the light source is guided through a window in the device that is transparent to the light beam.

6. The method as defined in claim 4, wherein the light beam is guided by means of a light guide through a vacuum passthrough in the device.

7. The method as defined in claim 1, wherein the electron beam and the specimen are arranged in a device for examining the specimen, and the light source of the light beam are arranged inside the device.

8. The method as defined in claim 1, wherein the light of a deuterium lamp having a wavelength region from 190 nm to 400 nm is used as the light beam.

9. The method as defined in claim 8, wherein only a subregion of the wavelength region emerging from the deuterium lamp is used to irradiate the surface of the specimen.

10. An apparatus for reducing an electron-beam-induced deposition of contamination products on a specimen, the apparatus comprising:
    a device for generating an electron beam that can be directed onto a surface of the specimen;
    a light source defining a light beam propagating from it, the light beam having an energy sufficient to reduce a thickness of the electron-beam-induced deposition of contamination products, wherein the light source is disposed such that the surface of the specimen is illuminated with the electron beam and the light beam simultaneously.

11. The apparatus as defined in claim 10, wherein the device for generating an electron beam and the specimen are arranged inside a device for examining a specimen, in particular a TEM, SEM, or CSEM, and the light source is arranged outside the device.

12. The apparatus as defined in claim 11, wherein the device has a window that is transparent to the light beam.

13. The apparatus as defined in claim 11, wherein a light guide is provided in such a way that the light beam travels from the light source inside the light guide through a vacuum passthrough into the interior of the device.

14. The apparatus as defined in claim 10, wherein a focusing device is provided for focusing the light beam onto the surface of the specimen.

15. The apparatus as defined in claim 10, wherein sensors, for detecting signals that derive from irradiation of the specimen with the electron beam, are arranged in such a way that they are not influenced by the light beam.

* * * * *